(12) United States Patent
Lin

(10) Patent No.: US 6,297,139 B1
(45) Date of Patent: Oct. 2, 2001

(54) METHOD OF FORMING A CONTACT HOLE IN A SEMICONDUCTOR WAFER

(75) Inventor: Kun-Chi Lin, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/479,921

(22) Filed: Jan. 10, 2000

(51) Int. Cl.[7] .................................................. H01L 21/44
(52) U.S. Cl. .............................................. 438/597; 438/398
(58) Field of Search .................................. 438/241, 254, 438/398, 253, 258, 397, 396

(56) References Cited

U.S. PATENT DOCUMENTS

| | | | |
|---|---|---|---|
| 5,679,608 | * 10/1997 | Cheung et al. | 438/622 |
| 5,907,782 | * 5/1999 | Wu | 438/398 |
| 6,027,967 | * 2/2000 | Parekh et al. | 438/254 |

* cited by examiner

Primary Examiner—David Nelms
Assistant Examiner—Dung Ang Le
(74) Attorney, Agent, or Firm—Winston Hsu

(57) ABSTRACT

The present invention provides a method of forming a contact hole of a DRAM on a semiconductor wafer. The semiconductor wafer comprises a substrate, a conductive layer positioned in a predetermined area of the substrate and a dielectric layer positioned on the surface of the substrate and covering the conductive layer. The method comprises forming an amorphous silicon ($\alpha$-Si) layer with an opening on the surface of the dielectric layer wherein the opening is positioned directly above the conductive layer and penetrates to the surface of the dielectric layer, forming a polysilicon layer uniformly on the surface of the amorphous silicon layer and performing a dry etching process to form a contact hole in the dielectric layer, the amorphous silicon layer and the polysilicon layer being used as a hard mask, the contact hole penetrating through the dielectric layer down to the surface of the conductive layer. The polysilicon layer is formed by performing a hemi-spherical grain (HSG) process to improve the resolution limit of the optical exposure tool of the lithographic process.

18 Claims, 9 Drawing Sheets

METHOD OF FORMING A CONTACT HOLE IN A SEMICONDUCTOR WAFER

FIELD OF THE INVENTION

The present invention relates to a method of forming a shrunk contact hole in a semiconductor wafer, and more particularly, to a method of forming a contact hole of a DRAM (dynamic random access memory) on a semiconductor wafer.

DESCRIPTION OF THE PRIOR ART

Dynamic random access memory (DRAM) is a collection of a large number of DRAM cells. Each of the cells has a metal oxide semiconductor (MOS) transistor in series with a capacitor. In order to electrically connect a drain of a MOS transistor to a storage node of the capacitor, a node contact is formed by filling doped polysilicon into a contact hole. This node contact enables the reading and writing of data that is electrically stored in the capacitor. Because the size of the contact hole affects the size of a memory cell and a logical circuit, forming a contact hole with a smaller size than the photoresist pattern is thus a field of considerable importance to DRAM manufacturers.

Please refer to FIG. 1 to FIG. 6. FIG. 1 to FIG. 6 are cross-sectional diagrams of forming a shrunk contact hole 38 on a semiconductor wafer 10 according to the prior art. The semiconductor wafer 10 comprises a silicon substrate 12, a doped area 14 positioned in a predetermined area of the silicon substrate 12, a silicide layer 16 positioned on the surface of the doped area 14, a gate 18 positioned on the surface of the silicon substrate 12 and a dielectric layer 24 formed of silicon oxide on the surface of the silicon substrate 12, as shown in FIG. 1. Each gate 18 comprises a silicon nitride spacer 22 on each of two opposite walls, and a silicon nitride passivation layer 20 on the top surface of the gate 18. The doped area 14 serves as a conductive layer, such as the drain or the source of a MOS transistor, and the silicide layer 16 is used to reduce the contact resistance between the subsequently formed node contact and the drain or the source of the MOS transistor.

According to the prior art, an LPCVD (low pressure chemical vapor deposition) process is performed to deposit a polysilicon layer 26 uniformly on the surface of the dielectric layer 24, as shown in FIG. 2. A spin coating process is then performed to form a photoresist layer 28 on the surface of the polysilicon layer 26, and a lithographic process is performed to form a pattern 30 in the photoresist layer 28, as shown in FIG. 3. An anisotropic etching process is performed to remove the polysilicon layer 26 under the pattern 30 down to the surface of the dielectric layer 24. A photoresist stripping process is then performed to totally remove the photoresist layer 28 so as to form an opening 32 in the polysilicon layer 26, as shown in FIG. 4. During the LPCVD process, the reactive temperature is kept between 600~650° C., and the reactive pressure is kept between 0.3~0.6 (torr).

An LPCVD process and a back etching process are performed to form a spacer on the interior walls of the opening 32, as shown in FIG. 5. A dry etching process is then performed to remove the dielectric layer 24 between the spacers 36 down to the surface of the silicide layer 16 so as to form a contact hole 38, as shown in FIG. 6. During the dry etching process, the polysilicon layer 26 and the spacer 36 serve as a hard mask, and the etching selectivity is controlled to remove the silicon oxide faster than the polysilicon.

As the design rule of semiconductor fabrication shrinks, the diameter of the contact hole 38 reduces to 0.15 μm, but the depth of the contact hole 38 still remains between 6~10 kÅ. During the lithographic process to form the pattern 30, the diameter of the pattern 30 on the photoresist layer 28 is limited to about 0.22 μm by the resolution limit of the optical exposure tool. In order to improve the limit of the lithographic process, a deposition and a back etching process are used to form the spacer 36 to reduce the diameter of the opening 32 so as to form the contact hole 38 with a smaller diameter.

The thickness of the spacer 36 is not uniform and changes with height, meaning that the thickness 35 is smaller than the thickness 37. As the spacer 36 becomes thinner during the dry etching process, the diameter of the formed contact hole 38 becomes larger than the original design size. This can lead to inadvertent etching of the passivation layer 20 and the spacer 22, causing them to be partially removed. This, in turn, leads to a shorter distance between the gate 13 and the conductive material subsequently filled into the contact hole 38, which causes electrical leakage and even short circuiting.

SUMMARY OF THE INVENTION

It is therefore a primary objective of the present invention to provide a method of forming a shrunk contact hole of a DRAM on a semiconductor wafer.

In a preferred embodiment, the present invention provides a method of forming a shrunk contact hole on a semiconductor wafer. The semiconductor wafer comprises a substrate, a conductive layer positioned in a predetermined area on the substrate, a dielectric layer positioned on the surface of the substrate and covering the conductive layer, the method comprising:

forming an amorphous silicon (α-Si) layer with an opening on the surface of the dielectric layer wherein the opening is positioned directly above the conductive layer and penetrates to the surface of the dielectric layer;

forming a polysilicon layer uniformly on the surface of the amorphous silicon layer;

performing a dry etching process to form a contact hole in the dielectric layer, the amorphous silicon layer and the polysilicon layer being used as a hard mask, the contact hole penetrating through the dielectric layer down to the surface of the conductive layer.

It is an advantage of the present invention that a single step HSG (hemi-spherical grain) process with selective growth properties according to the present invention replaces the dual step deposition and back etching process of the prior art. The present invention uses the HSG process to form a polysilicon layer with uniform thickness on the interior walls so as to reduce the diameter of the opening, improving the resolution limit of the lithographic process. Because the present invention uses the single step HSG process to replace the dual step deposition and back etching process, the cost of forming the contact hole is reduced. The present invention not only improves the resolution limit to satisfy design rule, but also reduces the cost of forming the contact hole.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
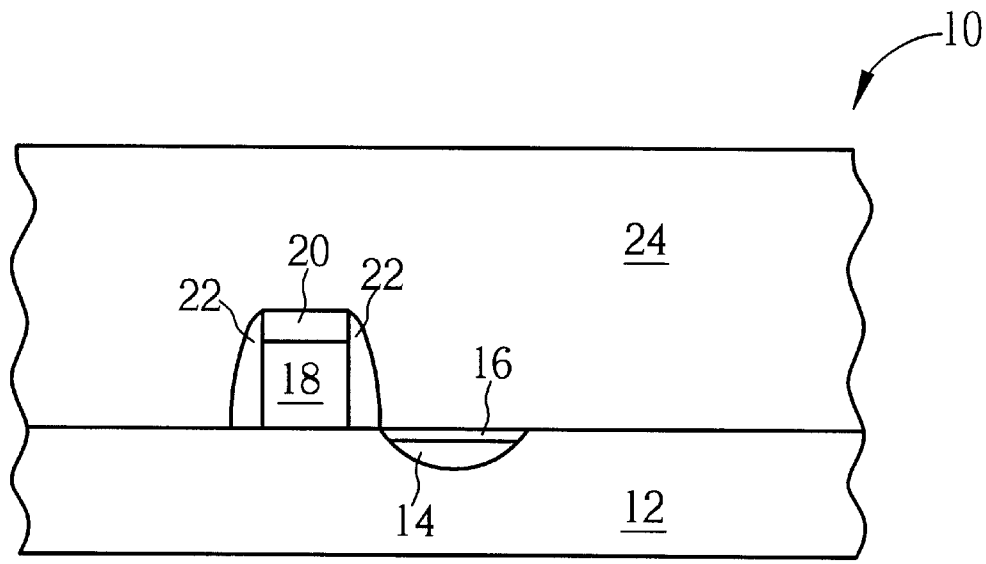
FIG. 1 to FIG. 6 are cross-sectional diagrams of forming a contact hole according to the prior art.
Figure 2:
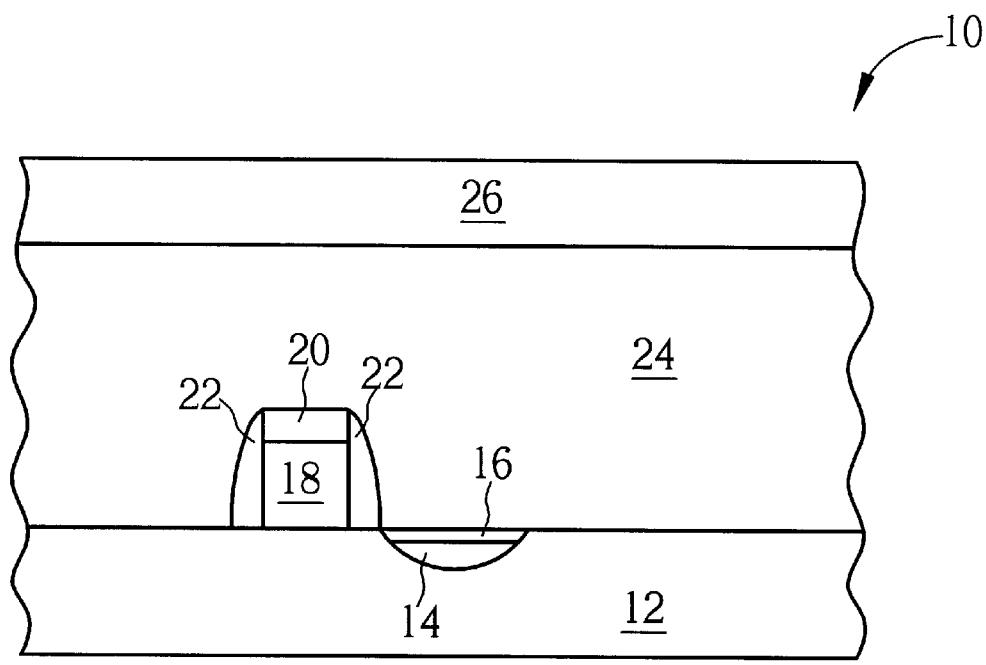
Figure 3:
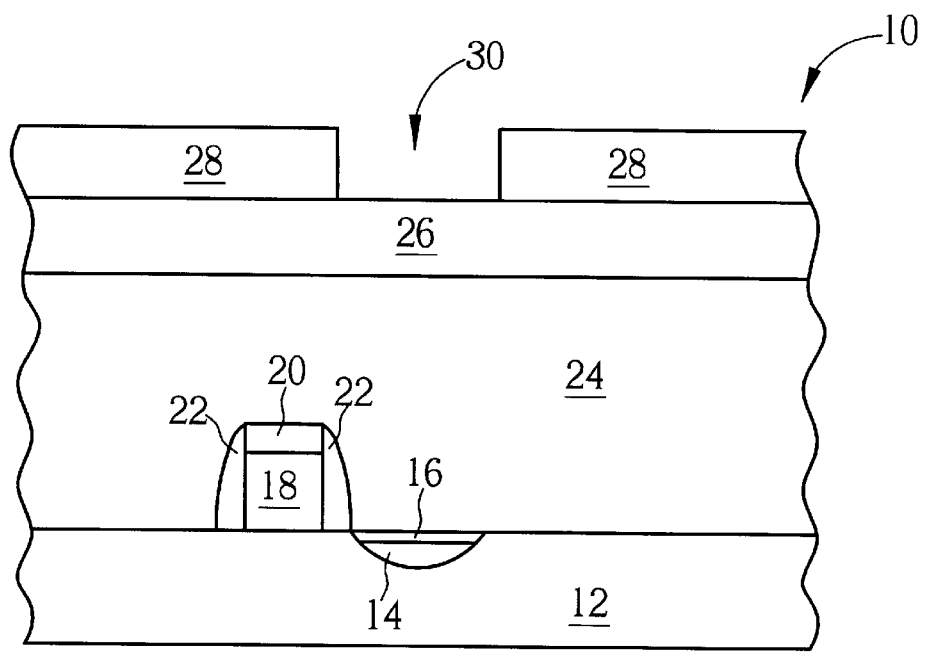
Figure 4:
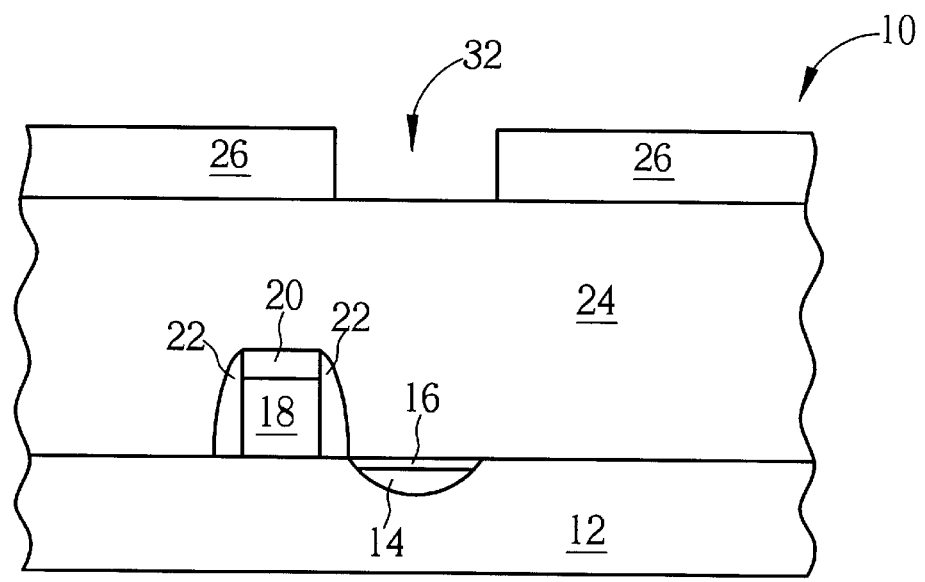
Figure 5:
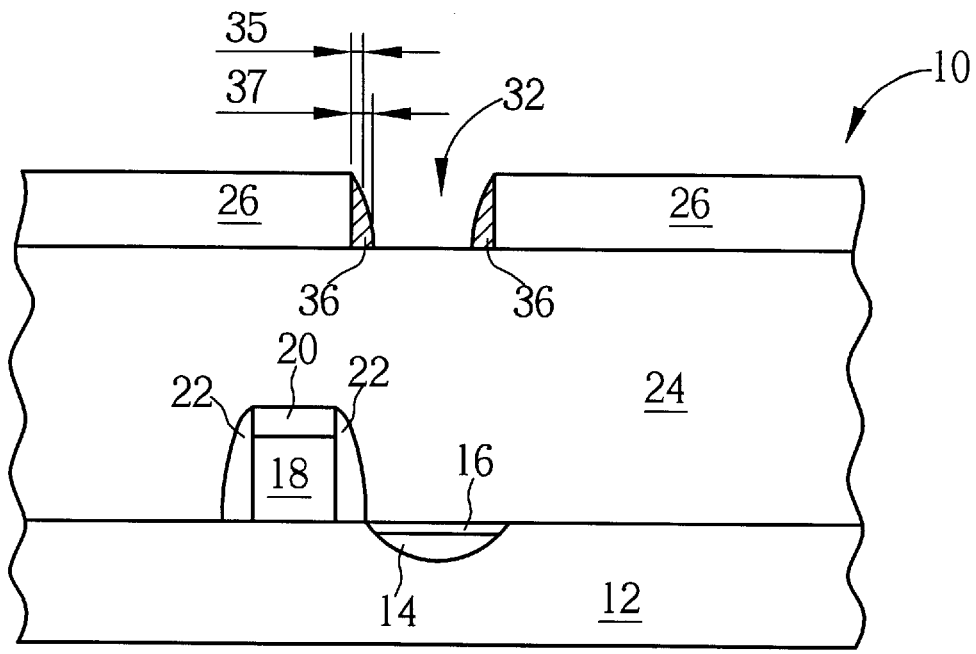
Figure 6:
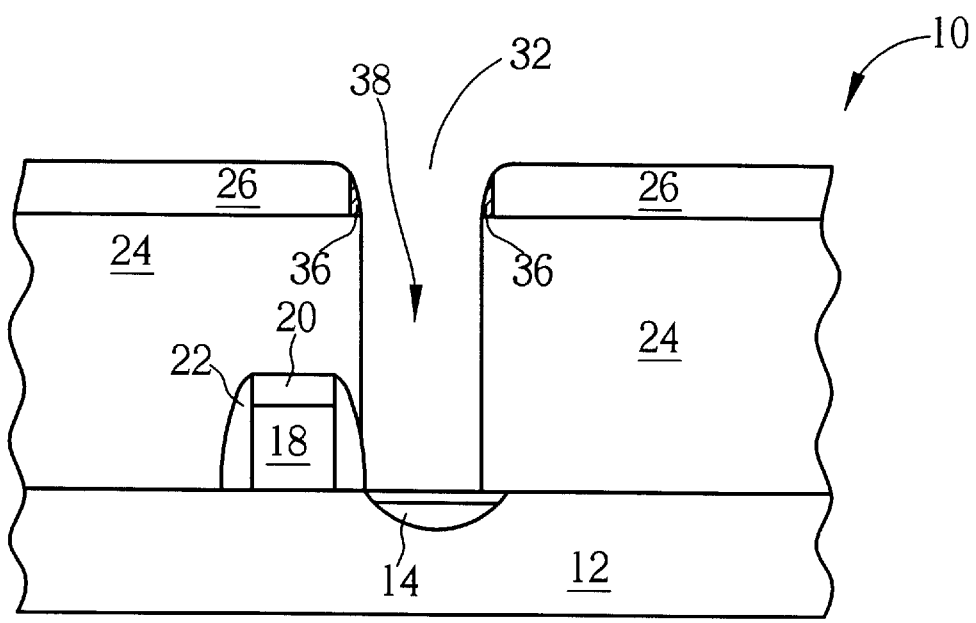
Figure 7:
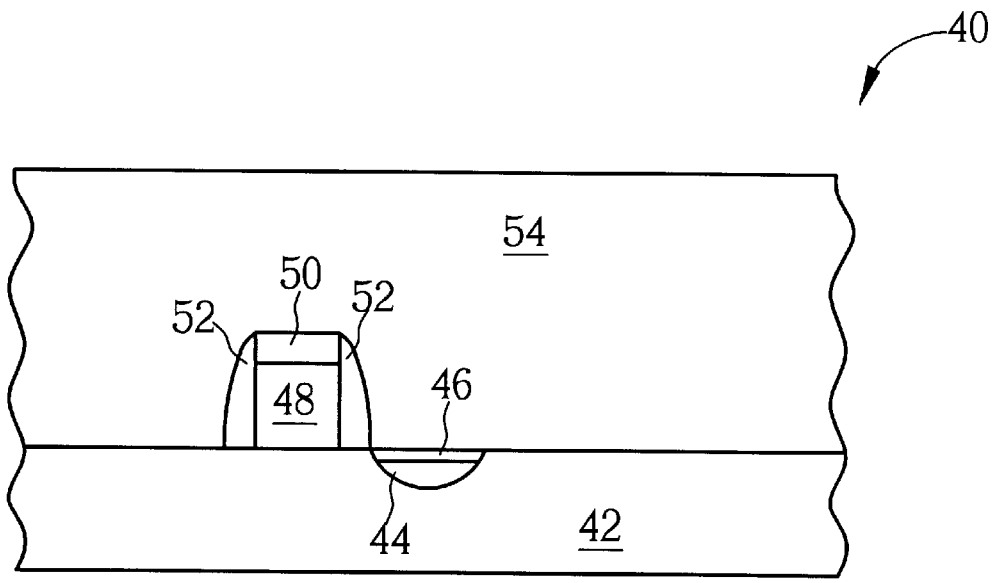
FIG. 7 to FIG. 12 are cross-sectional diagrams of forming a contact hole according to the present invention.

Please refer to FIG. 7 to FIG. 12. FIG. 7 to FIG. 12 are cross-sectional diagrams of forming a contact hole 66 on a semiconductor wafer 40 according to the present invention. The semiconductor wafer 40 comprises a substrate 42, a doped area 44 positioned in a predetermined area of the substrate 42, a silicide layer 46 positioned on the surface of the doped area 44, a gate 48 positioned on the substrate 42, and a dielectric layer 54 positioned on the surface of the substrate 42 and covering the silicide layer 46, as shown in FIG. 7. Each gate 48 comprises a silicon nitride spacer 52 on each of two opposite walls, and a silicon nitride passivation layer 50 on the top surface of the gate 48. The doped area 44 serves as a conductive layer, such as a drain or a source of a MOS transistor, and the silicide layer 46 is used to reduce the contact resistance between the subsequently formed node contact and the drain or the source of the MOS transistor.

Figure 8:
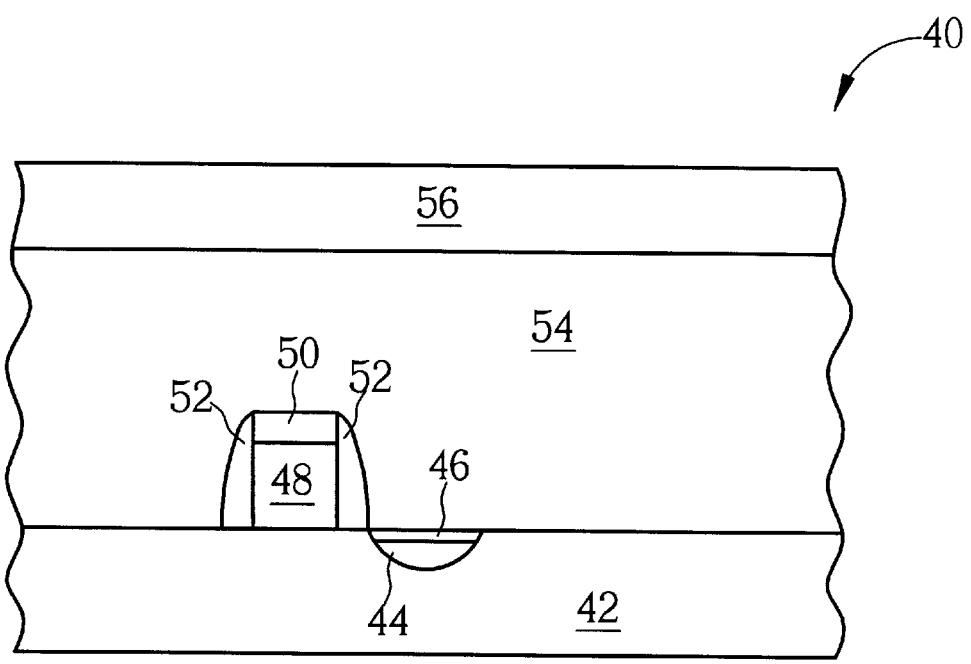
Figure 9:
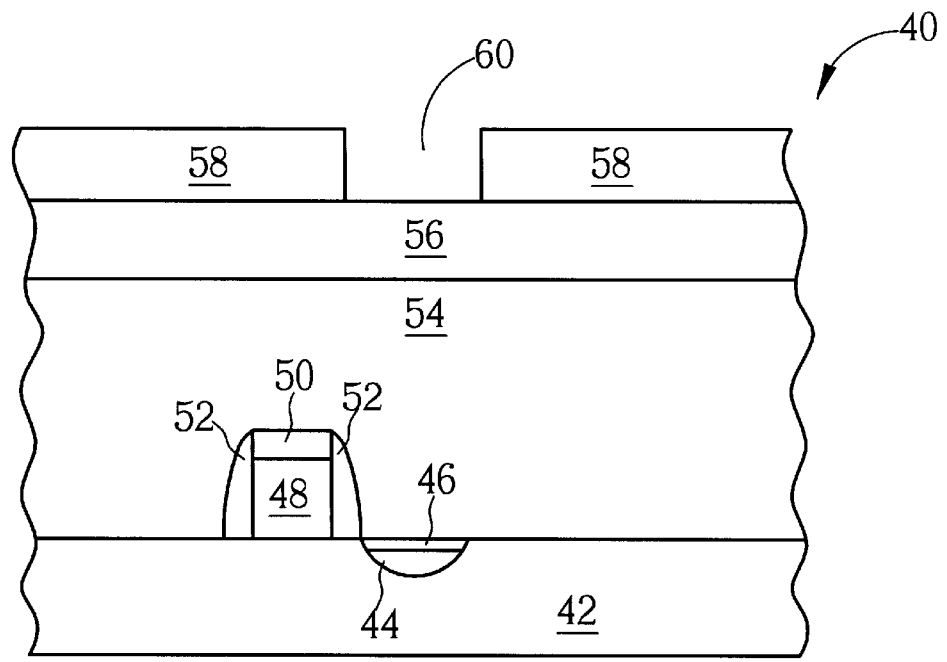
Figure 10:
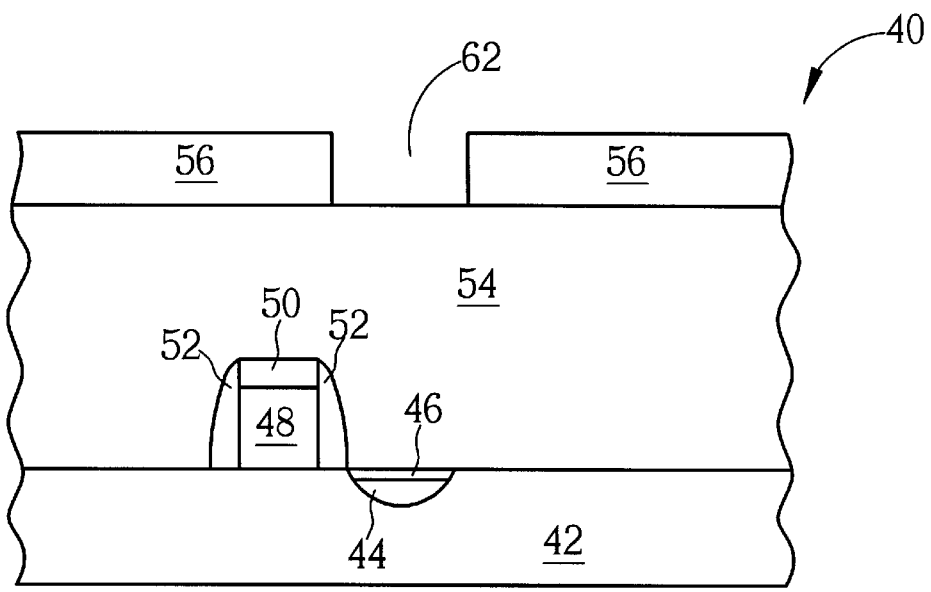

According to the present invention, an LPCVD process is performed to form an amorphous silicon layer 56 uniformly on the surface of the dielectric layer 54 wherein the amorphous silicon layer 56 serves as a first mask layer, as shown in FIG. 8. A spin-coating process is performed to form a photoresist layer 58 on the surface of the amorphous silicon layer 56. A lithographic process is then performed to form a pattern 60 in the photoresist layer 58 wherein the pattern 60 is positioned directly above the silicide layer 46, as shown in FIG. 9. An etching process is performed to vertically remove the amorphous silicon layer 56 under the pattern 60 down to the surface of the dielectric layer 54. Finally a photoresist stripping process is performed to totally remove the photoresist layer 58 and complete an opening 62 directly above the silicide layer 46, as shown in FIG. 10. Silane gas is injected during the LPCVD process, and the reactive temperature is kept below 575° C. so as to prevent the formation of polysilicon.

Figure 11:
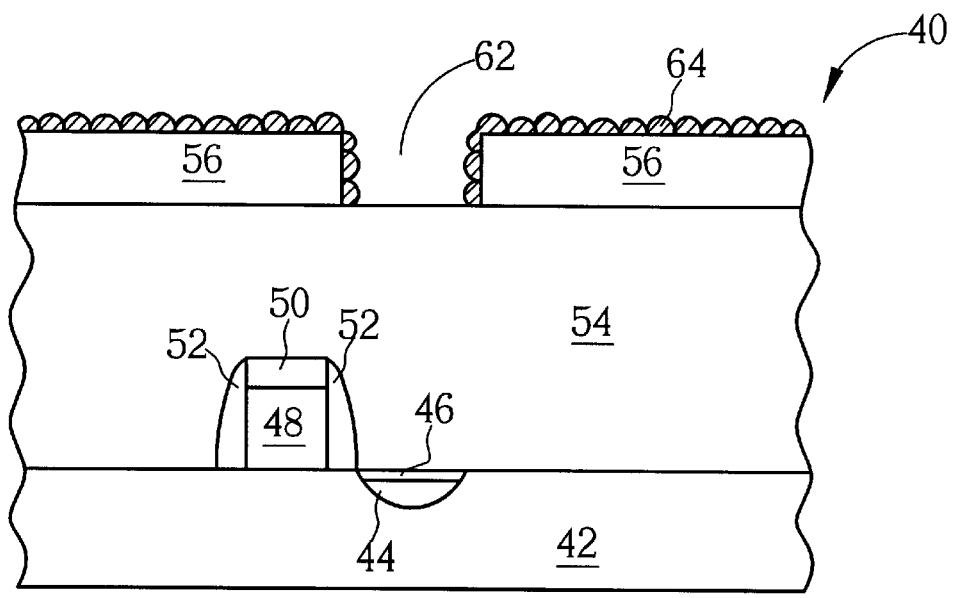
Figure 12:
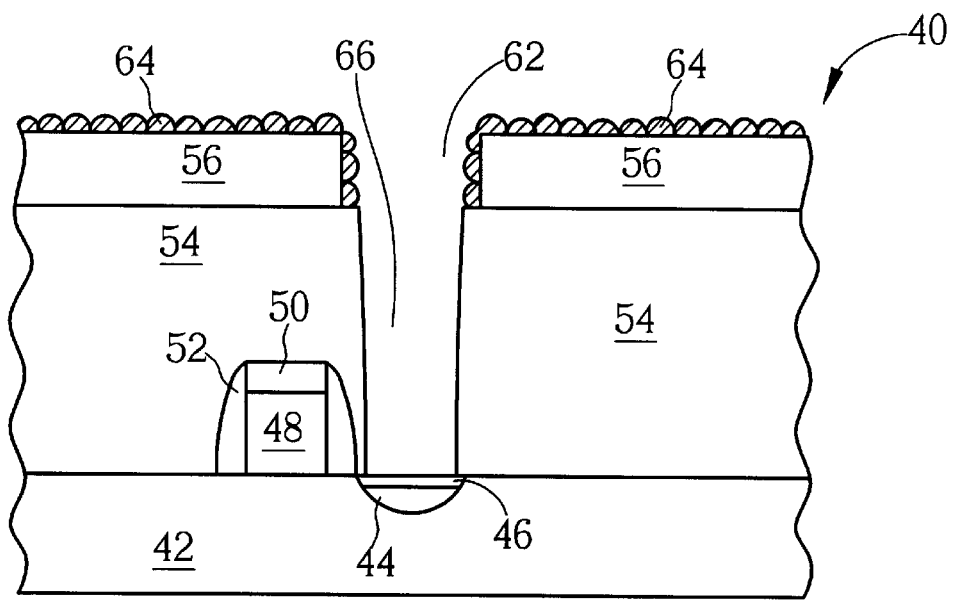

An ultra high vacuum hemi-spherical grain (UHV-HSG) process is next performed to uniformly form a polysilicon layer 64 with a hemi-spherical grain structure on the interior walls of the opening 62 and on the surface of the amorphous silicon layer 56, as shown in FIG. 11. The polysilicon layer 64 serves as a second mask layer. Finally, a dry etching process is performed to vertically remove the dielectric layer 54 between the polysilicon layer 64 of the opening 62 down to the surface of the silicide 46 so as to form a contact hole 66, as shown in FIG. 12. The amorphous silicon layer 56 and the polysilicon layer 64 serve as hard masks, and the formed contact hole 66 penetrates through the dielectric layer 54 down to the surface of the silicide layer 46.

The UHV-HSG process can be divided into three major steps: raising the temperature, seeding and annealing. Silane gas is injected only during the seeding step to form the polysilicon layer 64 on the surface of the amorphous layer 56 but not on the surface of the dielectric layer 54. The thickness of the polysilicon layer 64 is between 100~1000 Å.

Figure 13:
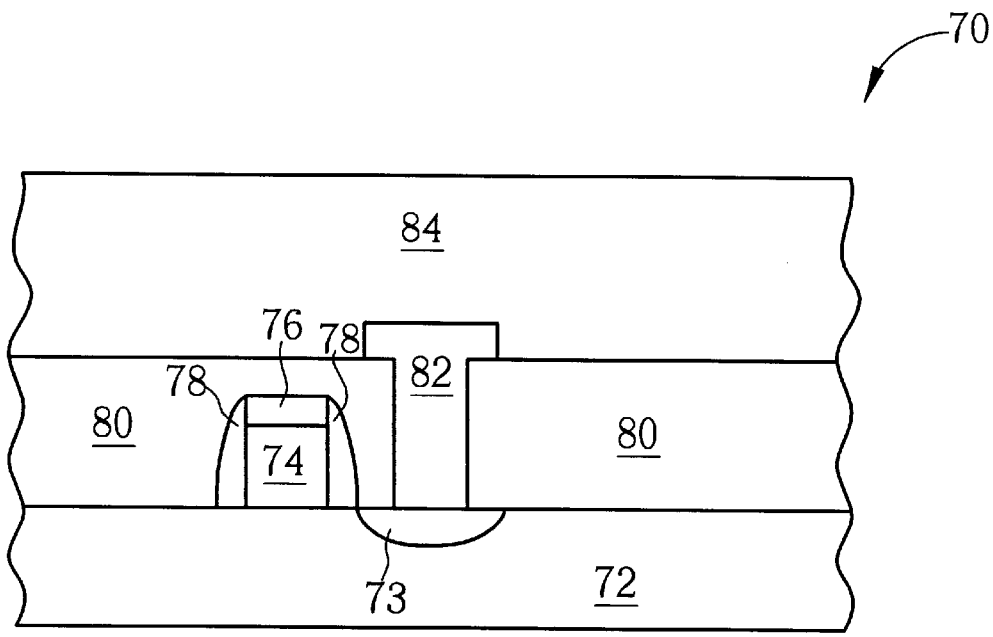
FIG. 13 to FIG. 17 are cross-sectional diagrams of forming a contact plug and storage node according to the present invention.

The present invention can also be applied to the formation of a bit line contact and a storage node contact of the DRAM. Please refer to FIG. 13 to FIG. 17. FIG. 13 to FIG. 17 are cross-sectional diagrams of forming a bit line contact and a storage node contact of the DRAM on a semiconductor wafer 70. The present invention first forms a contact hole 92 on a landing pad 82 and polysilicon is then filled into the contact hole 92 to form a node contact so as to reduce the size of the storage node contact. The semiconductor wafer 70 comprises a substrate 72, a doped area 73 positioned in a predetermined area of the substrate 72, a gate 74 positioned on the substrate 72, a dielectric layer 80 positioned on the surface of the substrate 72, a landing pad 82 positioned in the dielectric layer 80 and a dielectric layer 84 positioned on the surface of the dielectric layer 80 that covers the landing pad 82, as shown in FIG. 13. Each gate 74 comprises a silicon nitride spacer 78 on each of two opposite walls, and a silicon nitride passivation layer 76 on the top surface of the gate 74. The landing pad 82 is made of doped polysilicon or tungsten that serves as a conductive layer to electrically connect a drain or a source of a MOS transistor.

Figure 14:
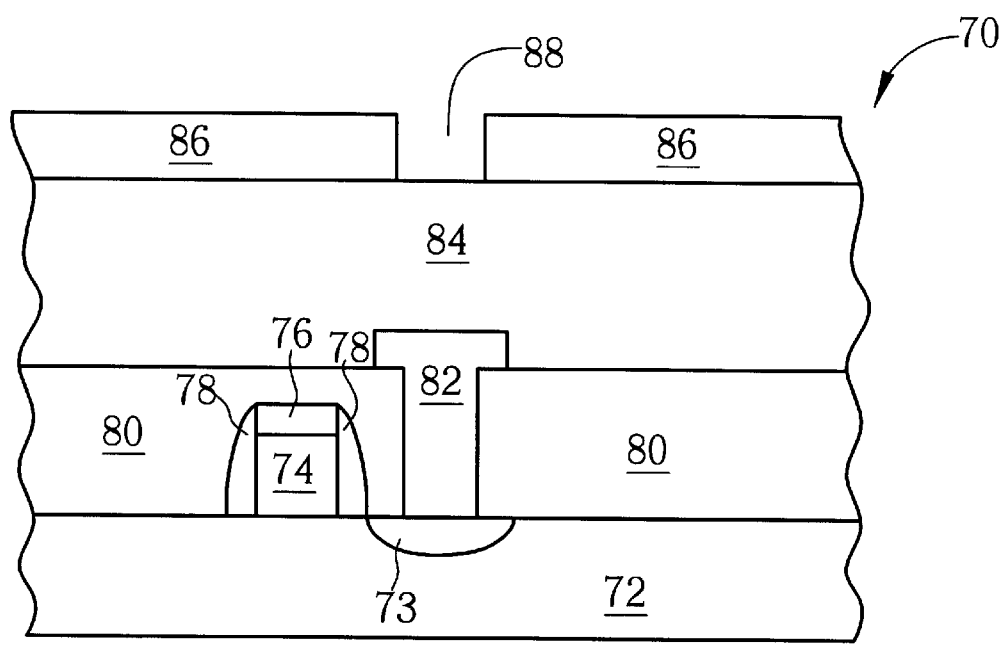

According to the present invention, an LPCVD process is performed to form an amorphous silicon layer 86 uniformly on the surface of the dielectric layer 84 wherein the amorphous silicon layer 86 serves as a first mask layer, as shown in FIG. 14. A spin-coating process is performed to form a photoresist layer (not shown) on the surface of the amorphous silicon layer 86 and a lithographic process is then performed to form a pattern in the photoresist layer. An etching process is performed to vertically remove the amorphous silicon layer 86 under the pattern of the photoresist layer down to the surface of the dielectric layer 84. The photoresist layer is then totally removed, completing an opening 88 directly above the landing pad 82.

Figure 15:
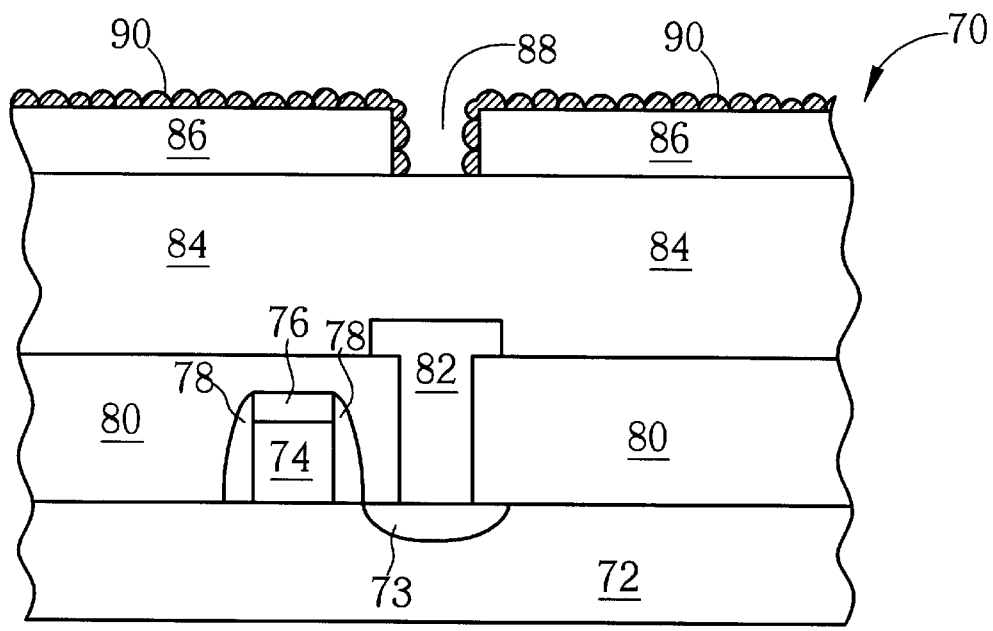
Figure 16:
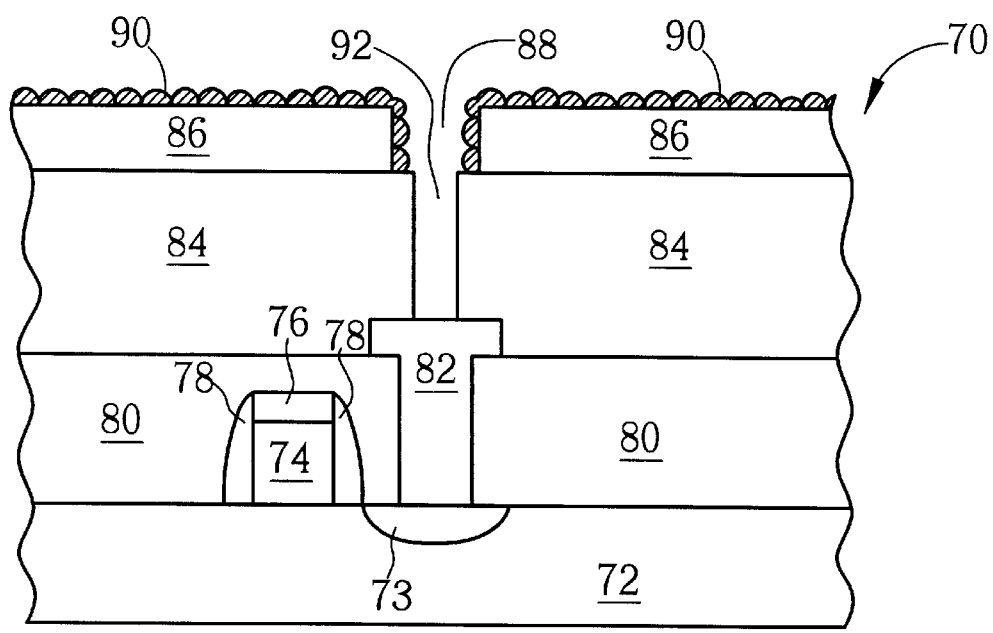

A UHV-HSG process is next performed to form a polysilicon layer 90 uniformly on the interior walls of the opening 88 and on the surface of the amorphous silicon layer 86 wherein the polysilicon layer 90 serves as a second mask layer, as shown in FIG. 15. Finally, a dry etching process is performed, using the amorphous silicon layer 86 and the polysilicon layer 90 as hard masks, to vertically remove the dielectric layer 84 between the polysilicon of the interior walls of the opening 88 down to the surface of the landing pad 82 so as to form a contact hole 92, as shown in FIG. 16. Generally speaking, a cleaning process is performed after the dry etching process to remove overhangs on the surface of the contact hole 92.

Figure 17:
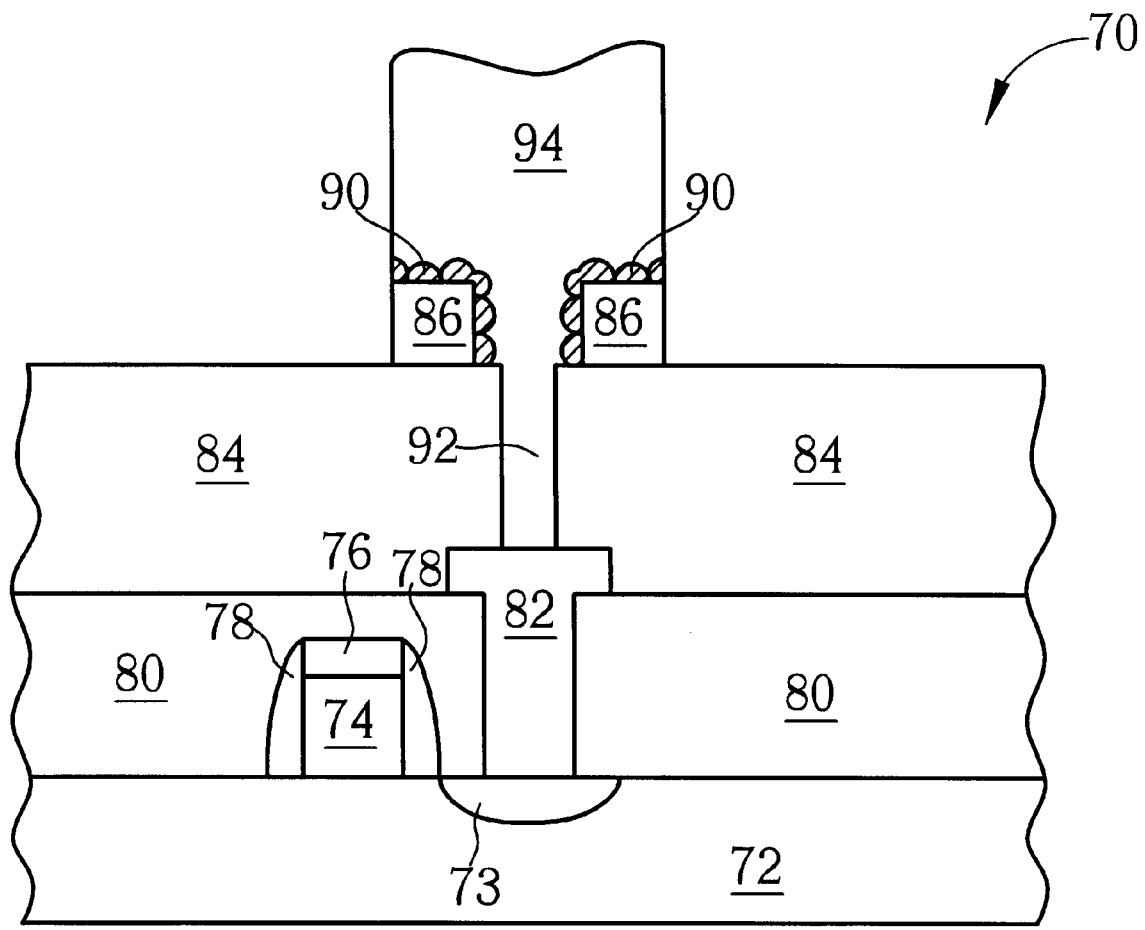

After the contact hole 92 is completed, a doped polysilicon layer 94 is formed on the surface of the semiconductor wafer 70 to fill the contact hole 92 and to cover the surface of the polysilicon layer 90. A lithographic process is performed to form a photoresist layer in a predetermined area on the doped polysilicon layer 94 to pattern a storage node. A dry etching process is then performed to remove the polysilicon layers 94, 90 and the amorphous layer 86 that are not covered by the photoresist layer down to the surface of the dielectric layer 84. Finally, the photoresist layer is removed to complete the formation of the storage node, as shown in FIG. 17. The polysilicon layer 94 on top of the contact hole 92 forms the storage node, and the polysilicon layer 94 in the contact hole 92 forms the node contact. The node contact serves as a contact plug and, together with the landing pad 82, electrically connects the source or drain of a MOS transistor to form a memory unit.

The present invention uses the amorphous silicon layer 86 as a first mask layer and the polysilicon layer 90 as a second mask layer. Both the amorphous silicon layer 86 and the polysilicon layer are made of a conductive material, and so both are kept after the contact hole is completed, becoming parts of the subsequently formed storage node. However, if the first and the second mask layers are made of an insulating material, it is necessary to perform a cleaning process to totally remove the first and the second mask layers from the surface of the semiconductor wafer after the contact hole 92 is completed.

The thicknesses of the polysilicon layers 64, 90 formed by the UHV-HSG process are kept between the 0.1~0.01 μm, improving the resolution limit of the optical exposure tool from 0.35 μm to 0.1 μm, according to the present invention. As the design rule falls below 0.1 μm, the present invention, in conjunction with optical exposure tools of a higher resolution, can satisfy these next-generation design rule. Because the thicknesses of the polysilicon layers 64, 90 formed by the UHV-HSG process are consistent along their heights, the interior walls of HSG polysilicon are not removed down to the first mask layer by the dry etching process. This prevents electrical leakage and short-circuiting.

Furthermore, unlike the spacer of the prior art, which is formed by performing a deposition and a back etching process to reduce the diameter of the opening, the present invention uses the HSG process to form a polysilicon layer with uniform thickness on the interior walls so to reduce the diameter of the opening. This improves the resolution limit of the lithographic process. Because the present invention uses the single step HSG process to replace the dual step deposition and back etching processes, the cost of forming the contact hole is reduced.

In contrast to the prior art method of forming a contact hole 38, the single step HSG process of the present invention replaces the dual step deposition and back etching processes according to the prior art. The present invention improves the resolution limit to satisfy the design rule of next-generation semiconductor devices, and reduces the cost of forming the contact hole.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a contact hole on a semiconductor wafer, the semiconductor wafer comprising a substrate, a conductive layer positioned in a predetermined area on the surface of the substrate, a dielectric layer positioned on the conductive layer, the method comprising:

forming an amorphous silicon layer with an opening on the surface of the dielectric layer wherein the opening is positioned directly above the conductive layer and penetrates to the surface of the dielectric layer;

forming a polysilicon layer uniformly on the surface of the amorphous silicon layer, and on walls within the opening so as to reduce the size of the opening;

performing a dry etching process to form a contact hole in the dielectric layer, the amorphous silicon layer and the polysilicon layer being used as a hard mask, the contact hole penetrating through the dielectric layer down to the of conductive.

2. The method of claim 1 wherein the amorphous silicon layer with the opening is formed by performing the following steps:

forming an amorphous silicon layer uniformly on the surface of the dielectric layer;

forming a photoresist layer on the surface of the amorphous silicon layer;

performing a lithographic process to form a pattern of the opening in the photoresist layer wherein the pattern is positioned directly above the conductive layer;

performing an etching process to vertically remove the amorphous silicon layer under the pattern of the photoresist layer down to the surface of the conductive layer to form the opening; and removing the photoresist layer.

3. The method of claim 1 wherein the polysilicon layer is formed by performing a hemi-spherical grain (HSG) process that forms a hemi-spherical grain structure uniformly on the surface of the amorphous silicon layer.

4. The method of claim 3 wherein the thickness of the polysilicon layer is between 100 and 1000 angstroms (Å).

5. The method of claim 1 wherein the substrate is a silicon substrate.

6. The method of claim 1 wherein the conductive layer is a doped area that is used as a drain or a source of a MOS (metal-oxide-semiconductor) transistor.

7. The method of claim 1 wherein the conductive layer is a landing pad that is used to electrically connect a drain or a source of a MOS transistor.

8. A method of forming a contact hole on a semiconductor wafer, the semiconductor wafer comprising a substrate, a conductive layer positioned in a predetermined area on the substrate, a dielectric layer positioned on the surface of the substrate and covering the conductive layer, the method comprising:

forming a first mask layer on the surface of the dielectric layer, the first mask layer comprising an opening, the opening positioned directly above the conductive layer and penetrating to the surface of the dielectric layer;

forming a second mask layer uniformly on the surface of the first mask layer, and on walls within the opening so as to reduce the size of the opening;

performing a dry etching process to form a contact hole in the dielectric layer, the first mask layer and the second mask layer being used as a hard mask, the contact hole penetrating to the surface of the conductive layer.

9. The method of claim 8 where in the following steps are performed after the dry etching process:

performing a cleaning process to totally remove the first and the second mask layers on the surface of the semiconductor wafer;

performing a cleaning process to remove overhangs produced on the surface of the contact hole during the dry etching process.

10. The method of claim 8 wherein the first mask layer is formed by following steps:

forming the first mask layer uniformly on the surface of the dielectric layer;

forming a photoresist layer on the surface of the first mask layer;

performing a lithographic process to form a pattern of the opening in the photoresist layer, the pattern positioned directly above the conductive layer;

performing an etching process to vertically remove the first mask layer under the pattern of the photoresist layer down to the surface of the conductive layer to form the opening; and removing the photoresist layer.

11. The method of claim 8 wherein the first mask layer is formed of amorphous silicon.

12. The method of claim 11 wherein the second mask layer is formed of polysilicon by performing a hemi-spherical grain (HSG) process that forms a hemi-spherical grain structure of polysilicon uniformly on the surface of the amorphous silicon layer.

13. The method of claim 12 wherein the thickness of the olysilicon layer is between 100 and 1000 angstroms (Å).

14. The method of claim 8 wherein the substrate is a silicon substrate.

15. The method of claim 14 wherein the conductive layer is a doped area used as a drain or a source of a MOS (metal-oxide-semiconductor) transistor.

16. The method of claim 8 wherein the conductive layer is a landing pad used to connect a drain or a source of a MOS transistor.

17. The method of claim 8 wherein the conductive layer is made of doped polysilicon or tungsten.

18. A method of forming a contact hole on a semiconductor wafer, the semiconductor wafer comprising a substrate, a conductive layer positioned in a predetermined area on the surface of the substrate, a dielectric layer positioned on the conductive layer, the method comprising:

forming an amorphous silicon layer with an opening on the surface of the dielectric layer wherein the opening is positioned directly above the conductive layer and penetrates to the surface of the dielectric layer;

forming a polysilicon layer uniformly by performing a hemi-spherical grain (HSG) process that forms a hemi-spherical grain structure on the surface of the amorphous silicon layer;

performing a dry etching process to form a contact hole in the dielectric layer, the amorphous silicon layer and the polysilicon layer being used as a hard mask, the contact hole penetrating through the dielectric layer down to the of conductive.

* * * * *